United States Patent
Deimling

(10) Patent No.: US 7,230,423 B2
(45) Date of Patent: Jun. 12, 2007

(54) METHOD FOR IMPROVING THE IMAGE HOMOGENEITY OF IMAGE DATA FROM PHASE-CYCLED STEADY STATE SEQUENCES

(75) Inventor: Michael Deimling, Moehrendorf (DE)

(73) Assignee: Siemens Aktiengesellschaft, Munich (DE)

( * ) Notice: Subject to any disclaimer, the term of this patent is extended or adjusted under 35 U.S.C. 154(b) by 4 days.

(21) Appl. No.: 11/134,461

(22) Filed: May 23, 2005

(65) Prior Publication Data

US 2005/0258830 A1    Nov. 24, 2005

(30) Foreign Application Priority Data

May 24, 2004    (DE)    ............ 10 2004 025 417

(51) Int. Cl.
*G01V 3/00*    (2006.01)
(52) U.S. Cl. ..................... 324/307; 324/309
(58) Field of Classification Search ............... 324/307, 324/309
See application file for complete search history.

(56) References Cited

U.S. PATENT DOCUMENTS

| | | | |
|---|---|---|---|
| 5,347,216 A * | 9/1994 | Foo .......................... | 324/309 |
| 6,307,368 B1 * | 10/2001 | Vasanawala et al. ....... | 324/309 |
| 6,906,516 B2 * | 6/2005 | Bangerter et al. ......... | 324/309 |
| 6,985,613 B2 * | 1/2006 | Ogino ........................ | 382/131 |
| 7,012,428 B1 * | 3/2006 | Ward et al. ................ | 324/309 |
| 7,103,490 B2 | 9/2006 | Deimling | |
| 2002/0183612 A1 | 12/2002 | Deimling | |
| 2005/0030023 A1 | 2/2005 | Bangerter | |

FOREIGN PATENT DOCUMENTS

| | | |
|---|---|---|
| DE | 101 21 802 A1 | 11/2002 |
| DE | 102 47 150 A1 | 4/2004 |
| EP | 0 704 062 B1 | 6/2002 |
| JP | 11225988 A | 8/1999 |

OTHER PUBLICATIONS

M.Deimling et al.: "Constructive interference in steady state (CISS) for motion sensitivity reconstruction", in: Book of Abstracts: Society of Magnetic Resonance in Medicine, 1989, p. 842.
N.K.Bangerter et al.: General Framework for the SNR Analysis of Multiple-Acquisition SSFP, in: Book of abstracts: Intl.Society of Mag.Reson.Med., 2003, p. 976.
E.M.Haacke et al.: α Steady-state free precession imaging in the presence of motion: application for improved visualization of the carebrospinal fluid, Radiology, vol. 175, 1990, pp. 545-552.
Neal K. Bangerter et al.: "Analysis of Multiple-Acquisition SSFT", Magnetic Resonance in Medicine, vol. 51, 2004, pp. 1038-1047.
German Office Action dated Nov. 6, 2006.

* cited by examiner

*Primary Examiner*—Louis M. Arana
(74) *Attorney, Agent, or Firm*—Harness, Dickey & Pierce, PLC

(57) ABSTRACT

Nuclear spin tomography (synonym: magnetic resonance tomography, MRT) is applied in medicine for the purpose of examining patients. A method is proposed for improving the image homogeneity of image data from phase-cycled steady state sequences in magnetic resonance tomography. In the method, both the sum of squares (SOS) and the maximum intensity projection (MIP) are calculated, pixel-wise, from the image data of the participating sequences. Further, a result image optimized with regard to image homogeneity is obtained by pixel-wise combination of the sum-of-squares image and MIP image.

16 Claims, 8 Drawing Sheets

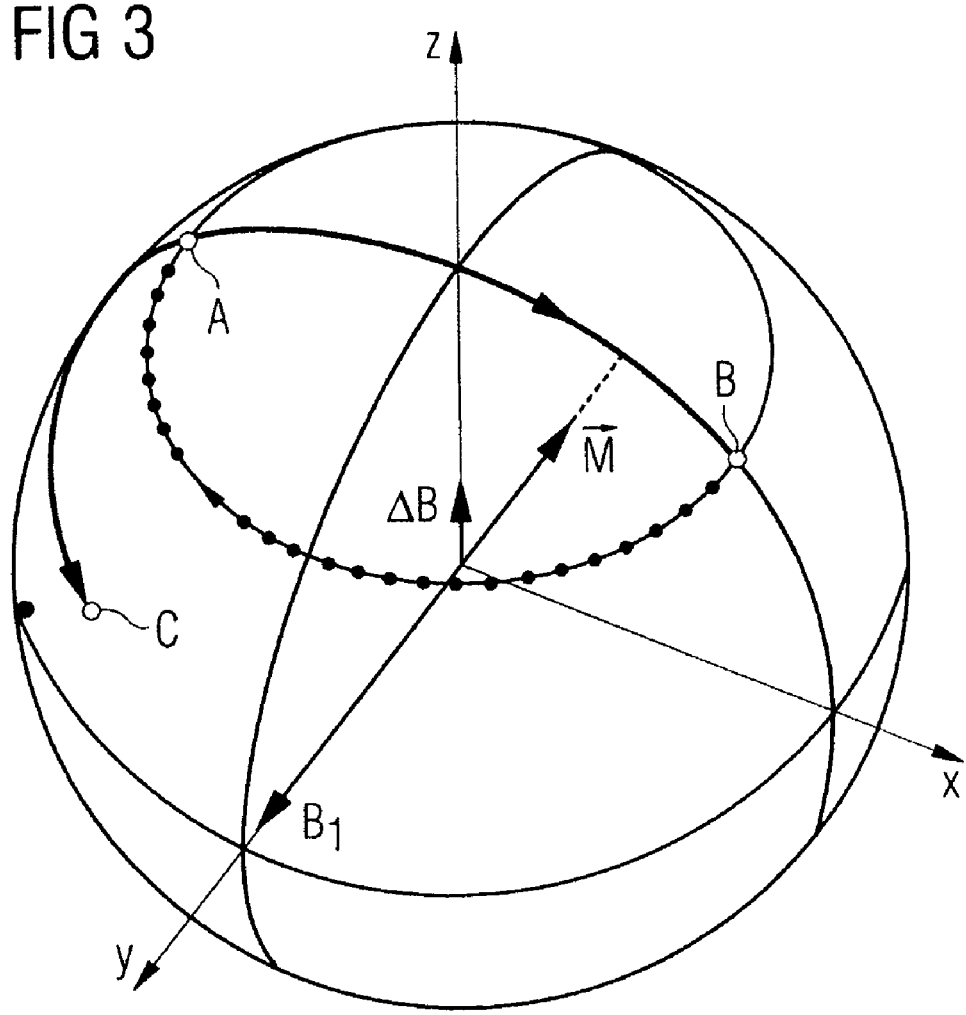

true FISP

Phase alternation:

$\alpha^+$-TR-$\alpha^-$-TR-$\alpha^+$-TRtrue FISP

Phase alternation:

$\alpha^+$-TR-$\alpha^+$-TR-$\alpha^+$-TR-

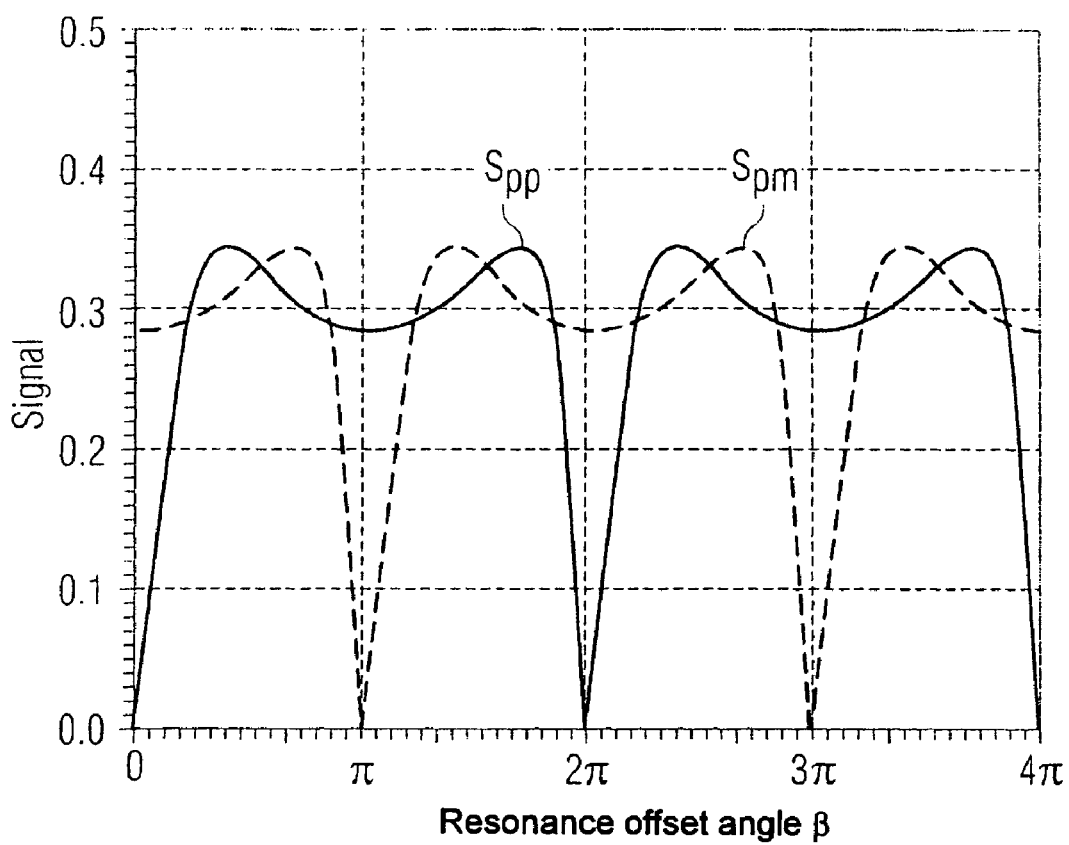

METHOD FOR IMPROVING THE IMAGE HOMOGENEITY OF IMAGE DATA FROM PHASE-CYCLED STEADY STATE SEQUENCES

The present application hereby claims priority under 35 U.S.C. §119 on German patent application number DE 10 2004 025 417.6 filed May 24, 2004, the entire contents of which is hereby incorporated herein by reference.

FIELD OF THE INVENTION

The present relation relates in general to nuclear spin tomography (synonym: magnetic resonance tomography, MRT) such as is applied in medicine for the purpose of examining patients, for example. The present invention relates, more particularly, to a method for improving the image homogeneity when use is made of phase-cycled steady state sequences.

BACKGROUND

MRT is based on the physical phenomenon of nuclear spin resonance and has been used successfully as an imaging method for over 20 years in medicine and in biophysics. In this examination method, the object is exposed to a strong, constant magnetic field. This aligns the nuclear spins of the atoms in the object, which were previously irregularly oriented. High frequency waves can now excite these "ordered" nuclear spins to a specific oscillation.

In MRT, this oscillation produces the actual measurement signal, which is picked up by use of suitable receiving coils. It is possible in this case by using inhomogeneous magnetic fields produced by gradient coils to code the measurement object in the respective region of interest—also called FOV (Field Of View)—in three dimensions in all three spatial directions, something which is generally denoted as "location coding".

In MRT, the data are picked up in the so-called k domain (synonym: frequency domain). The MRT image in the so-called image domain is linked to the MRT data in the k domain by use of Fourier transformation. The location coding of the object, which defines the k domain, is performed by using gradients in all three spatial directions. A distinction is made here between slice selection (determines a recording slice in the object, usually the z-axis), frequency coding (determines a direction in the slice, usually the x-axis) and phase coding (determines the second dimension inside the slice, usually the y-axis).

Thus, the first step is to excite a slice selectively—for example in the z-direction. The coding of the location information in the slice is performed by a combined phase and frequency coding by way of these two abovementioned orthogonal gradient fields that are produced, in the example of a slice excited in the z-direction, by the gradient coils, likewise already mentioned, in the x- and y-directions.

A possible way of picking up the data in an MRT experiment is based on the so-called true FISP sequence, which is illustrated in FIG. 2. FISP stands for "Fast Imaging with Steady Precession" and is the special form of a gradient echo sequence.

As with conventional imaging sequences, rephasing also takes place here with reference to a slice selection gradient $G_S$, as does preliminary dephasing with reference to a readout gradient $G_R$. This gradient switching compensates the dephasing of the transverse magnetization caused by the gradients, thus producing an echo signal that is denoted as gradient echo. The basic idea is thus that the transverse magnetization is restored after the signal readout and can be used for the next sequence pass.

The echo signal is generated exclusively by gradient reversal.

The repetition time TR is the time after which one HF excitation pulse follows the other. The echo signal follows after time $$T_E = \frac{T_R}{2}$$

and can be acquired by use of a readout gradient $G_R$.

The true FISP signal is distinguished by total symmetry in the time domain, that is to say the gradient profiles are completely balanced $$\left(\sum_i G_i t_i = 0\right).$$

All the magnetization components are refocussed again owing to the total symmetry of the gradient profiles in the time domain, and so the ideal steady state signal is produced after a short settling time.

During phase coding, a gradient field is switched on for a fixed time before the acquisition of the steady state signal and after the acquisition, the strength of said gradient field being lowered (↓) or raised (↑) stepwise by an amount $\Delta G_p$ with each sequence pass.

The true FISP sequence can be carried out with the aid of different HF excitation schemes that differ from one another in a different phase angle of the succeeding high frequency pulse α. The simplest HF excitation scheme is an HF pulse sequence without a phase difference in the HF pulse:

... $\alpha_{0°}$-TR-$\alpha_{0°}$-TR-$\alpha_{0°}$ ....

A further HF excitation scheme within the framework of a true FISP sequence is represented by a phase alternation of the HF pulses:

... $\alpha_{0°}$-TR-$\alpha_{180°}$-TR-$\alpha_{0°}$ ....

Such a scheme is illustrated by way of example in FIG. 2, the alternation being symbolized by positive and negative amplitudes of the HF pulses. HF pulses with a phase angle of 0° are marked (α+) with a plus sign, while HF pulses with a phase angle of 180° are provided (α−) with a minus sign. Further possible HF excitation schemes would be combinations of HF pulses with phase angles of 0°, 90°, 180°, 270° and/or any desired further values between 0° and 360°, and/or integral multiples thereof.

In the case of relatively complex combinations, the HF pulse (flip angle α) is provided with an index exposing the respective phase angle, for example ... $\alpha_{0°}$-TR-$\alpha_{90°}$-TR-$\alpha_{180°}$-TR-$\alpha_{270°}$-TR-$\alpha_{0°}$- ....

True FISP measurements with different HF excitation pulse schemes are also denoted as "phase-cycled steady state sequences" and generally deliver different data records.

The direct sequence of a number of phase-cycled steady state sequences is denoted as a CISS (Constructive Interference in Steady State) sequence. The CISS sequence is used for high-resolution $T_2$ imaging by means of which it is possible, in particular, to measure liquids with very high intensity on the basis of the favorable small $T_1/T_2$ ratio.

In general, the CISS sequence is therefore based on the n-fold measurement of a 2D or 3D true FISP data record with a changed HF excitation scheme in each case. A maximum of four different schemes (n=4) are currently used.

The combination of phase-alternating HF pulses with non-phase-alternating HF pulses (n=2) constitutes the simplest case of a CISS sequence. This delivers two different data records S plus-minus ($S_{pm}$) and S plus-plus ($S_{pp}$):

$$S_{pm}[\ldots \alpha^+\text{-}TR\text{-}\alpha^-\text{-}TR\text{-}\alpha^+\text{-}\ldots]$$

$$S_{pp}[\ldots \alpha^+\text{-}TR\text{-}\alpha^+\text{-}TR\text{-}\alpha^+\text{-}\ldots],$$

each of these data records per se generally having the typical strip artifacts (signal minima) of a true FISP sequence.

The true FISP sequence alone places high demands on the calibration of hardware and software. Even a slight maladjustment or else local B0-field inhomogeneities lead to disturbing unacceptable interference strips (strip artifacts) in the reconstructed image. The interference (signal extinctions) results in this case from the fact that after being flipped by the excitation pulse α, the magnetization vector precesses by an off-resonance angle β in the rotating reference system during the repetition time TR at various points of the tissue. Depending on the HF excitation scheme, the α pulse is capable of flipping the magnetization vector such that the steady state is maintained, or else the α pulse reduces the steady state to a very small value.

FIG. 3 illustrates this state of affairs for a precession angle β=180° (=π). The magnetization vector $\vec{M}$ is flipped from point A to point B in the xz-plane by an $\alpha^+$ excitation pulse, for example. During the repetition time, the magnetization vector $\vec{M}$ precesses back again to A along the dotted circular segment. The vector $\vec{M}$ can therefore be flipped to B at A by means of a new subsequent $\alpha^+$ excitation pulse. An $\alpha^-$ excitation pulse would bring the vector $\vec{M}$ from point A on the great circle to a position C, and thus lead to an oscillatory behavior with very low equilibrium magnetization.

It is therefore necessary to distinguish as follows:

In a true FISP sequence with phase alternation ( . . . $\alpha^+$-TR-$\alpha^-$- . . . ), signal extinctions occur at the points i, j where the precession angle of the transverse magnetization $\vec{M}_{xy}=\vec{B}_1$ yields an angle $$\beta_{ij}=2\pi\gamma\cdot\Delta B_{0ij}\cdot TR=\pi$$

within the TR time.

In a true FISP sequence without phase alternation ( . . . $\alpha^+$-TR-$\alpha^+$- . . . ), signal extinctions occur at the points i, j where the precession angle of the transverse magnetization $\vec{M}_{xy}=\vec{B}_1$ yields an angle $$\beta_{ij}=2\pi\gamma\cdot\Delta B_{0ij}\cdot TR=n\cdot 2\pi$$

within the TR time (with n=0, 1, 2, . . . ).

The situation for the two cases is illustrated in FIGS. 4a and 4b. FIG. 4a shows the interference pattern of a true FISP sequence with phase alternation, and FIG. 4b the same without phase alternation. The negative interference (signal extinction black) is produced by a resonance offset β=nπ or β=n2π (n=0, 1, 2, . . . ) relative to the resonant frequency in the rotating reference system during the time TR because of hardware imperfections and/or B0-field inhomogeneities. As can be seen, both patterns are displaced relative to one another by nπ (n=0, 1, 2, . . . ).

The profile of the signal intensity as a function of the off-resonance angle β is illustrated in FIG. 5. The continuous line shows the signal profile of a true FISP sequence without phase alternation with signal extinctions at n 2π (n=0, 1, 2, . . . ). The dashed line shows the signal profile of a true FISP sequence with phase alternation, the signal extinctions exhibiting a periodicity of n π (n=0, 1, 2, . . . ) here.

These "off-resonance artifacts" can be reduced with the aid of suitable manipulation of the complex raw data (for example complex addition and/or subtraction with subsequent fast Fourier transformation FFT, absolute-value generations and renewed addition).

However, the calculation of the sum of squares (SOS) from the respective absolute-value generators $S_{pp}$ and $S_{pm}$ has proved to be simpler and yet still similarly effective:

$$SOS_{ij}:=\sqrt{(Spp_{ij})^2+(Spm_{ij})^2}.$$

A further method is based on the pixel-wise calculation of the maximum intensity projection (MIP) between the two absolute-value generators $S_{pp}$ and $S_{pm}$:

$$MIP_{ij}:=\begin{cases} Spp_{ij} & \text{if } Spm_{ij} \leq Spp_{ij} \\ Spm_{ij} & \text{if } Spm_{ij} > Spp_{ij} \end{cases}$$

The intensity profile of the $SOS_{ij}$ values is illustrated in FIG. 6a, and the intensity profile of the $MIP_{ij}$ values is illustrated in FIG. 6b (pixel values $SOS_{ij}$ and $MIP_{ij}$ as a function of β).

Nevertheless, in each case a relatively high residual ripple remains with reference to amplitude (ripple Δ) and location variation δr in the respective result image.

SUMMARY

An object of at least one embodiment of the present invention is to provide a method by which the signal inhomogeneity of images from phase-cycled steady state sequences is further improved.

According to at least one embodiment of the invention, a method is for improving the image homogeneity of image data from phase-cycled steady state sequences in magnetic resonance tomography, in which both the sum of squares (SOS) and the maximum intensity projection (MIP) are calculated pixel-wise from the image data of the participating sequences. Further, a result image optimized with regard to image homogeneity is obtained by pixel-wise combination of the sum-of-squares image and MIP image.

The combination may advantageously take place in the form of a weighted mean of the sum-of-squares image and MIP image in such a way that the respective SOS value multiplied by a selected factor p∈[0.1] may be added pixel-wise to the corresponding MIP value multiplied by a factor q=1−p.

The factor p may be advantageously selected such that the residual ripple of the result image with reference to variation in amplitude and location may be reduced or even minimized.

In a possible very simple and therefore uncomplicated embodiment of the present invention, use may be made of only two phase-cycled steady state sequences.

In this case, measurements are advantageously to be made with the aid of a phase-alternating and a non-phase-alternating sequence.

Also, an apparatus may be provided that is suitable for carrying out a method as set forth above.

BRIEF DESCRIPTION OF THE DRAWINGS

Further advantages, features and characteristics of the present invention are explained in more detail below with the aid of example embodiments and with reference to the accompanying drawings, in which:

FIG. 3 shows a possible precession behavior of the transverse magnetization in the rotating reference system on the basis of B0 field inhomogeneities, FIG. 5 shows a possible dependence of the signal profile on the resonance-offset angle β in the case of a true FISP sequence with and without phase alternation ($S_{pm}$ and $S_{pp}$, respectively)

DETAILED DESCRIPTION OF THE EXAMPLE EMBODIMENTS

Figure 1:
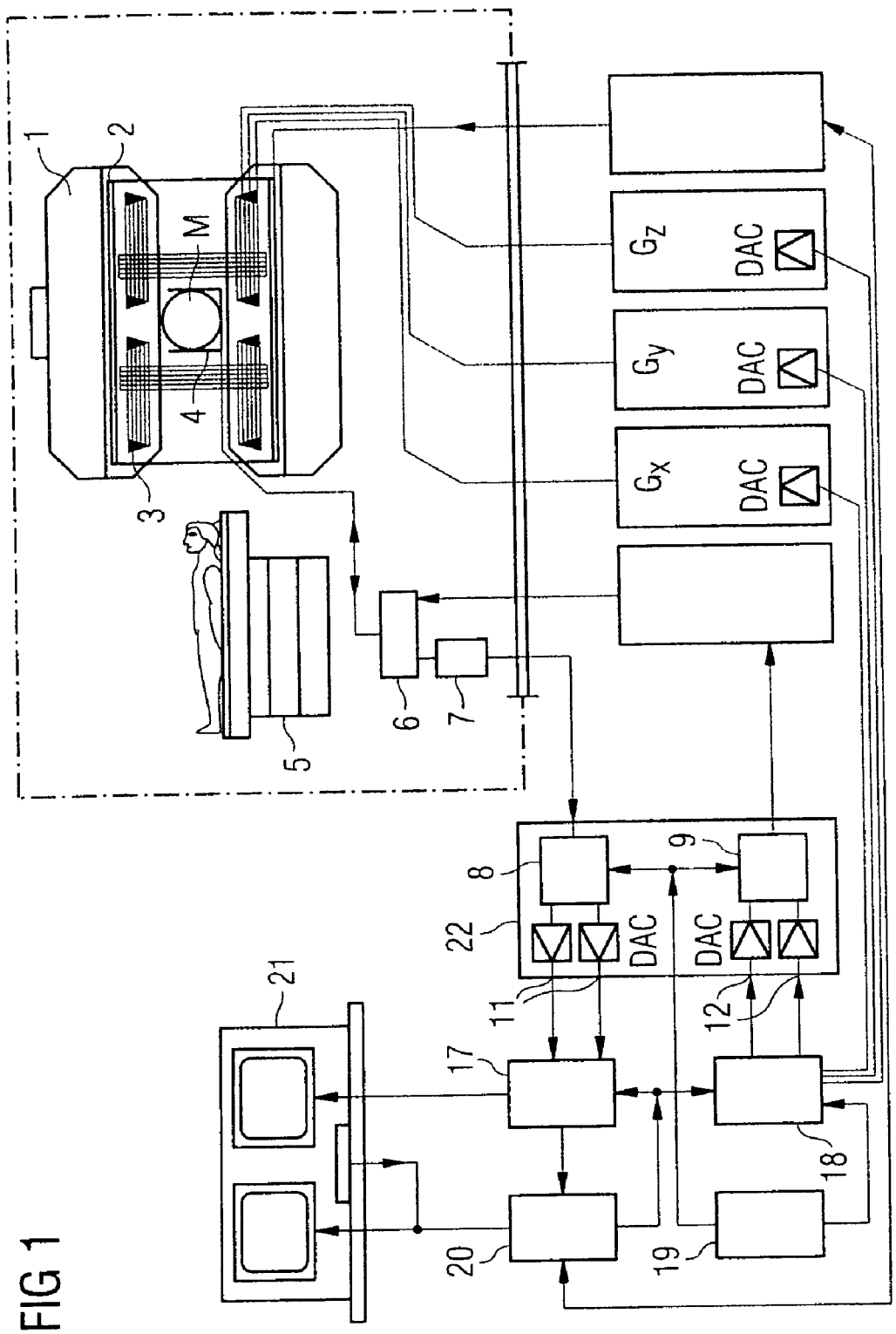
FIG. 1 shows a conventional nuclear spin tomography machine that is suitable for carrying out the method according to an embodiment of the invention.
Figure 2:
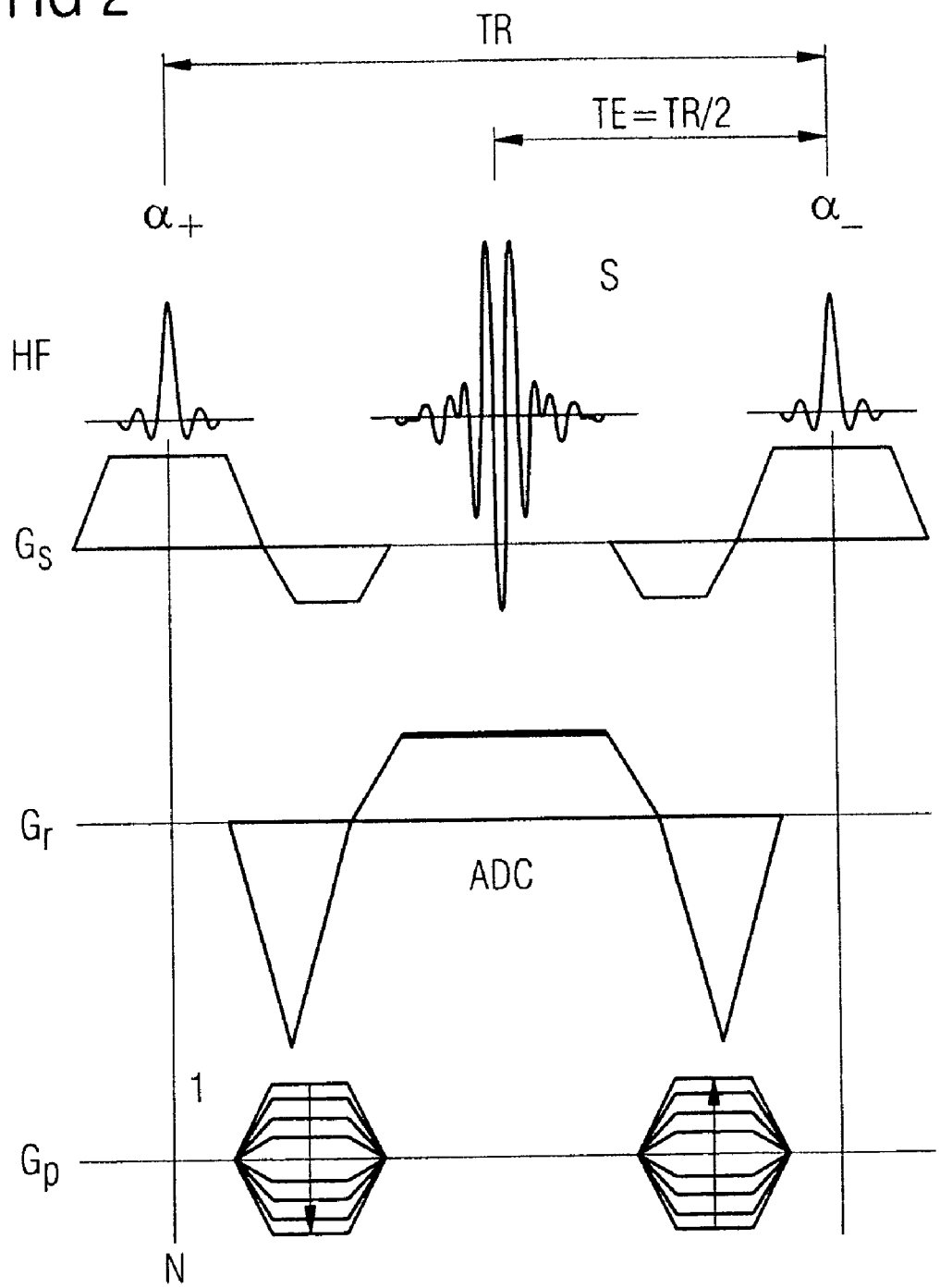
FIG. 2 shows a phase-alternating true FISP sequence.
Figure 4A:
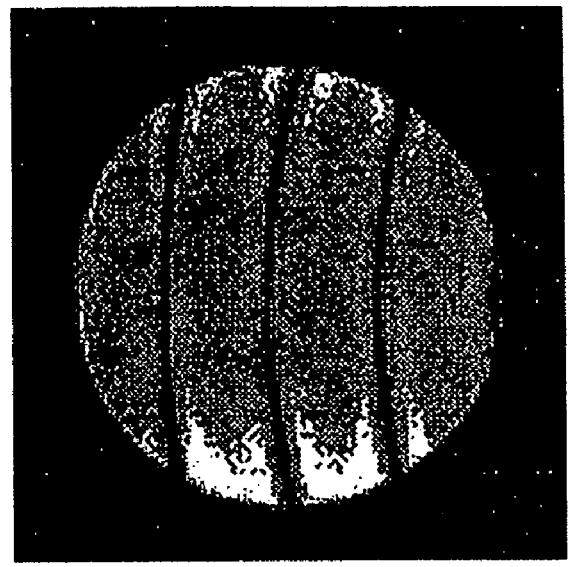
FIG. 4 shows typical strip artifacts of a true FISP sequence with and without phase alternation.
Figure 4B:
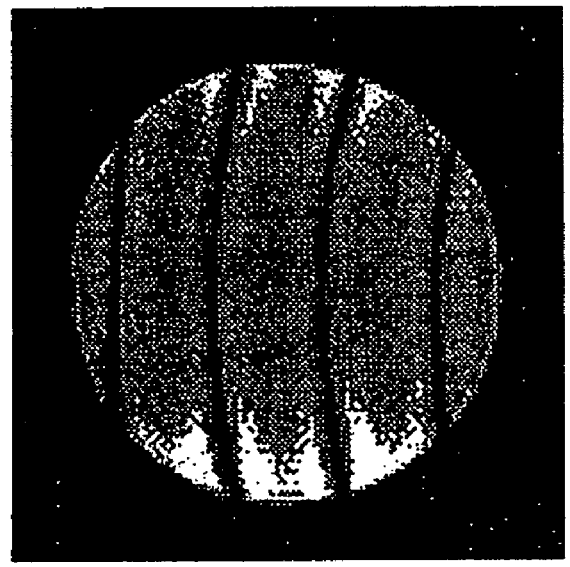

FIG. 1 shows a schematic of a nuclear spin tomography machine for producing a nuclear spin image of an object in accordance with an embodiment of the present invention. The design of the nuclear spin tomography machine corresponds here to the design of a conventional tomography machine. A basic field magnet 1 generates a temporally constant strong magnetic field for the polarization and alignment of the nuclear spins in the examination zone of an object such as, for example, a part to be examined in a human body.

The high homogeneity of the basic magnetic field that is required for nuclear spin resonance measurement is defined in a spherical measurement volume M into which the parts of the human body that are to be examined are introduced. So-called shim plates made from ferromagnetic material are fitted at a suitable point to provide support for the homogeneity requirements and, in particular, in order to reduce or even eliminate temporally invariable influences. Temporally variable influences may be reduced or even eliminated by shim coils 2 that are driven by a shim power supply 15.

Inserted into the basic field magnet 1 is a cylindrical gradient coil system 3 that includes three part windings. Each part winding is supplied by an amplifier 14 with current for generating a linear gradient field in the respective direction of the Cartesian coordinate system. The first part winding of the gradient field system 3 in this case generates a gradient $G_x$ in the x-direction, the second part winding generates a gradient $G_y$ in the y-direction, and the third part winding generates a gradient $G_z$ in the z-direction. Each amplifier 14 includes a digital-to-analog converter that is driven by a sequence control 18 for generating gradient pulses at the correct time.

Located inside the gradient field system 3 is a high-frequency antenna 4 with the aid of which the high-frequency pulses output by a high-frequency power amplifier 30 are converted into an alternating magnetic field by exciting the nuclei and aligning the nuclear spins of the object to be examined or of the zone of the object to be examined. The alternating field emanating from the precessing nuclear spins, that is to say in general the nuclear spin echo signals caused by a pulse sequence of one or more high-frequency pulses and one or more gradient pulses, is also converted by the high-frequency antenna 4 into a voltage that is fed via an amplifier 7 to a high-frequency receiving channel 8 of a high-frequency system 22.

The high-frequency system 22 further includes a transmitting channel 9 in which the high-frequency pulses for exciting the magnetic nuclear resonance are generated. Here, the respective high-frequency pulses are represented digitally in the sequence control 18 as a sequence of complex numbers on the basis of a pulse sequence prescribed by the system computer 20. This numerical sequence is fed as real part and as imaginary part via in each case one input 12 to a digital-to-analog converter in the high-frequency system 22, and by the latter to a transmitting channel 9. The pulse sequences are modulated in the transmitting channel 9 onto a high-frequency carrier signal whose base frequency corresponds to the resonant frequency of the nuclear spins in the measurement volume.

A transceiver filter 6 switches over from transmit mode to receive mode. The high-frequency antenna 4 irradiates the high-frequency pulses for exciting the nuclear spins into the measurement volume M, and samples resulting echo signals. The correspondingly obtained nuclear resonance signals are demodulated in a phase-sensitive fashion in the receiving channel 8 of the high-frequency system 22 and converted via a respective analog-to-digital converter into the real part and imaginary part of the measurement signal.

An image is reconstructed by an image computer 17 from the measured data obtained in such a way. The management of the measured data, the image data and the control programs is performed via the system computer 20. The sequence control 18 uses a prescription with control programs to control the generation of the respectively desired pulse sequences and the corresponding sampling of the k-domain.

In particular, the sequence control 18 controls in the process the correct switching of the gradients, the emission of the high-frequency pulses with a defined phase and amplitude, and the reception of the nuclear resonance signals. The time base for the high-frequency system 22 and the sequence control 18 is made available by a synthesizer 19. The selection of appropriate control programs for producing a nuclear spin image, and the display of the generated nuclear spin image are performed via a terminal 21 that includes a keyboard and one or more display screens.

In accordance with an embodiment of the present invention, the nuclear spin tomography machine is operated with the aid of a CISS pulse sequence. This is generated by the sequence control 18. The method according to an embodiment of the invention is implemented in the image computer 17 and in the system computer 20.

Figure 7:
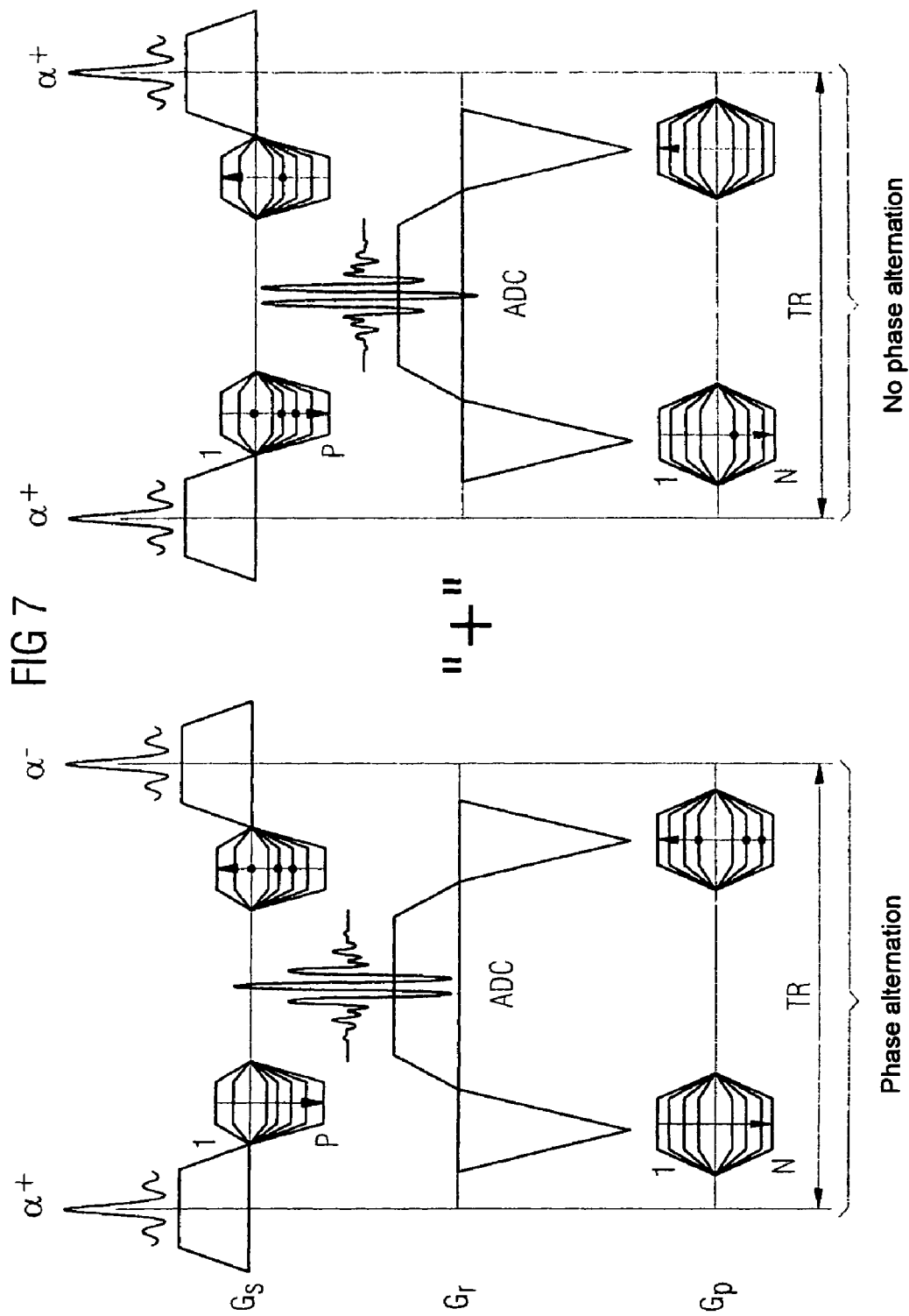
FIG. 7 shows a 2-cycle CISS sequence with phase-alternating and non-phase-alternating subsequences.
Figure 8:
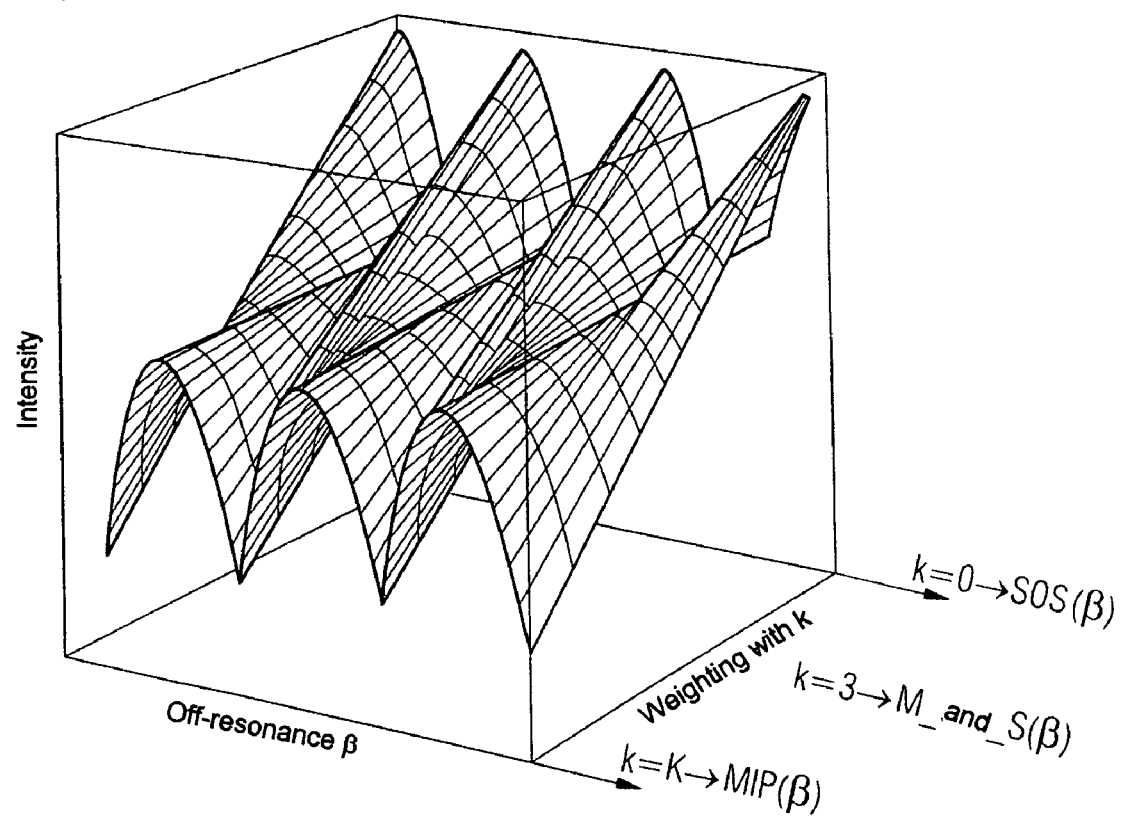
FIG. 8 shows in three dimensions the profile of the residual ripple in the case of 10 different weighting factors.

As mentioned in the introduction to the description, the combination of phase-alternating HF pulses with non-phase-alternating HF pulses (n=2) constitutes the simplest case of a CISS sequence. Such a two-cycle CISS sequence is illustrated in FIG. 7. The first step is to perform a true FISP sequence with phase alternation, that is to say with alternatingly positive and negative HF excitation pulses α+ and α−. Subsequently, the same true FISP sequence is processed without phase alternation, that is to say with exclusively positive HF excitation pulses α+. The combination of the two sequences is symbolized in the drawing by the "+" sign. Except for the sign of the HF excitation pulses, both the HF pulses and the gradient pulses in the slice selection direction, in the readout direction and in the phase coding direction are exactly the same.

Such a CISS sequence delivers overall two complete data records Spp and Spm, doing so in each case after the Fourier transformation and generation of the absolute values of the complex raw data. These Spp and Spm data are firstly combined according to an embodiment of the invention in two types of way:

The first combination is performed by pixel-wise calculation of the sum of squares (SOS)

$$SOS_{ij} := \sqrt{(Spp_{ij})^2 + (Spm_{ij})^2}.$$

Figure 6A:
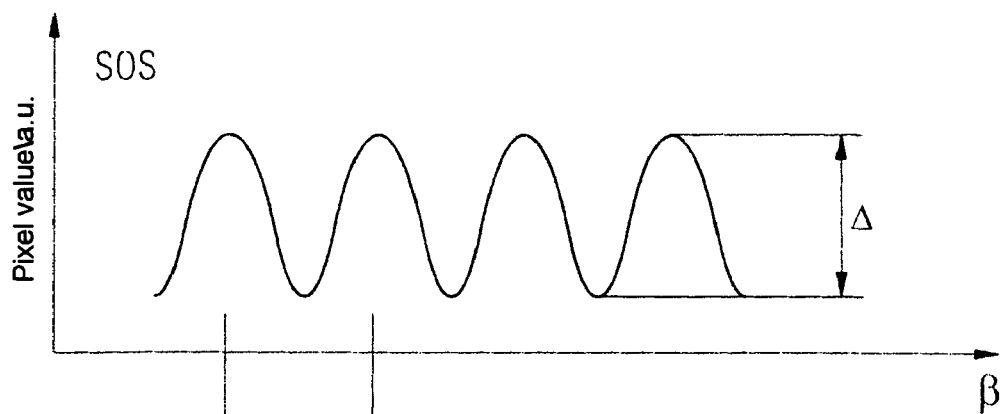
FIG. 6a shows a possible residual ripple of an SOS-averaged CISS image.

This delivers an image having a β-dependent intensity profile in accordance with FIG. 6a.

The second combination is performed by pixel-wise calculation of the MIP (Maximum Intensity Projection) image:

$$MIP_{ij} := \begin{cases} Spp_{ij} & \text{if } Spm_{ij} \leq Spp_{ij} \\ Spm_{ij} & \text{if } Spm_{ij} > Spp_{ij} \end{cases}$$

Figure 6B:
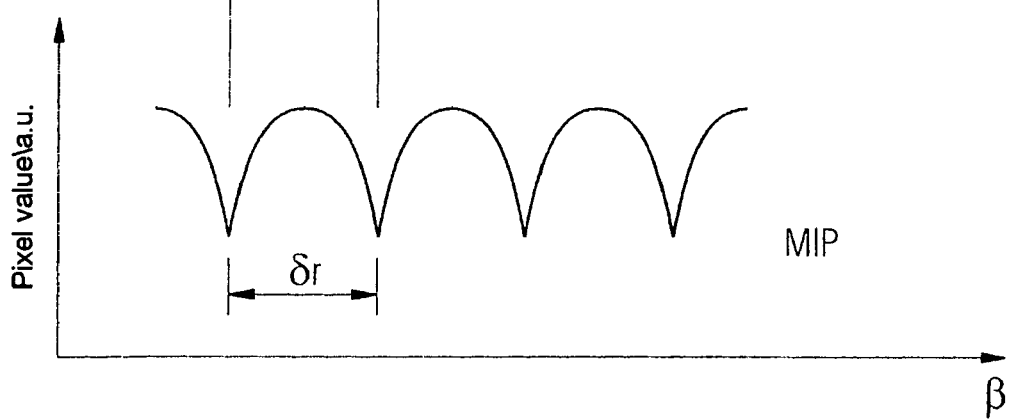
FIG. 6b shows a possible residual ripple of an MIP-averaged CISS image.

Such an MIP image has a β-dependent intensity profile in accordance with FIG. 6b.

The two combination images (SOS image and MIP image) have a residual ripple with reference to amplitude (ripple Δ) and location variation δr that is to be seen in substantial and therefore disturbing interference (strip artifacts) of the respective picture.

An embodiment of the present invention resides in undertaking a further image processing step in order to reduce the residual ripple of the final image to such an extent that disturbing strip artifacts no longer appear. This is realized by virtue of the fact that the SOS image and MIP image are combined pixel-wise in a further step in the image computer 17 and in the system computer 20. The combination is advantageously performed by weighted addition in the form of a weighted average from the SOS image and MIP image. However, other suitable combination methods can also be applied.

In the case of the weighted addition, the respective SOS value multiplied by a selected factor p∈[0.1] is added pixel-wise to the corresponding MIP value multiplied by a factor q=1−p.

The factor p, and thus also the corresponding factor q can be formed by a fraction composed of natural numbers $$p = \frac{k}{K},$$

K∈N, k=1, 2, ... K, so that the weighting is also performed stepwise:

$$M\_and\_S_{ijk} := \left(1 - \frac{k}{K}\right) \cdot SOS_{ij} + \frac{k}{K} MIP_{ij}.$$

Figure 6C:
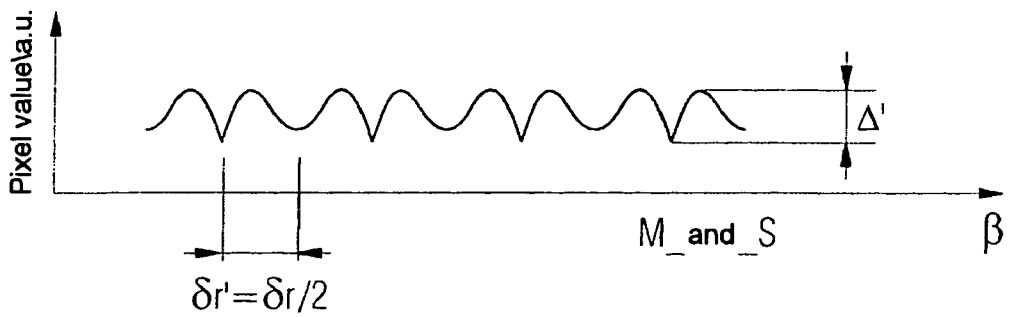
FIG. 6c shows a possible residual ripple of a CISS image averaged according to the invention.

Such a weighted addition (M_and_S) for the two methods SOS and MIP leads to an image with a further reduction in the signal homogeneity $$\Delta' = \frac{I_{max} I_{min}}{I_{mean}}$$

and to a doubling of the "ripple frequency"

$$\delta r' = \frac{\delta r}{2}$$

as is made plain by FIG. 6c. As may be seen, with this type of image post processing both effects lead as a whole to a calmer image impression.

The dependence of the residual ripple on the respective weighting factor $$p = \frac{k}{K}$$

is illustrated in three dimensions for the values K=10, k=0, ... K. The ripple of a pure MIP image is obtained for values with k=K. The ripple of a pure SOS image is obtained for values with k=0. In the middle range, $$p = \frac{k}{K}$$

can be selected optimally such that the residual ripple of the result image is reduced or even minimized with reference to amplitude variation and location variation, and assumes a profile in accordance with FIG. 6c, for example.

It is to be noted that an image combination weighted in such a way is also possible for CISS sequences with an arbitrary number of phase cycles (n>1). The residual ripple can be reduced or even minimized yet further by multiple repetition of the same true FISP sequence with different phase angles of the HF excitation pulse. The sole disadvantage of raising the number of phase cycles is the rising time outlay, for which reason it is necessary in the final analysis to weigh up between a high level of image homogeneity and a short measurement period.

Any of the aforementioned methods may be embodied in the form of a system or device, including, but not limited to, any of the structure for performing the methodology illustrated in the drawings.

Further, any of the aforementioned methods may be embodied in the form of a program. The program may be stored on a computer readable media and is adapted to perform any one of the aforementioned methods when run on a computer device (a device including a processor). Thus, the storage medium or computer readable medium, is adapted to store information and is adapted to interact with a data processing facility or computer device to perform the method of any of the above mentioned embodiments.

The storage medium may be a built-in medium installed inside a computer device main body or a removable medium arranged so that it can be separated from the computer device main body. Examples of the built-in medium include, but are not limited to, rewriteable non-volatile memories, such as ROMs and flash memories, and hard disks.

Examples of the removable medium include, but are not limited to, optical storage media such as CD-ROMs and DVDs; magneto-optical storage media, such as MOs; magnetism storage media, such as floppy disks (trademark), cassette tapes, and removable hard disks; media with a built-in rewriteable non-volatile memory, such as memory cards; and media with a built-in ROM, such as ROM cassettes.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A method for improving the image homogeneity of image data from phase-cycled steady state sequences in magnetic resonance tomography, the method comprising:
    calculating the sum of squares (SOS) and the maximum intensity projection (MIP), pixel-wise, from the image data of the participating sequences; and
    obtaining a result image, optimized with regard to image homogeneity, by pixel-wise combination of the sum-of-squares image and MIP image.

2. The method as claimed in claim 1, wherein the combination takes place in the form of a weighted mean of the sum-of-squares image and MIP image in such a way that the respective SOS value multiplied by a selected factor $p \in [0.1]$ is added, pixel-wise, to the corresponding MIP value multiplied by a factor $q=1-p$.

3. The method as claimed in claim 2, wherein use is made of two phase-cycled steady state sequences.

4. The method as claimed in claim 3, wherein

5. An apparatus including an image computer and a system computer for carrying out a method as claimed in claim 2.

6. The method as claimed in claim 2, wherein the factor p is selected such that the residual ripple of the result image with reference to variation in amplitude and location is minimized.

7. The method as claimed in claim 3, wherein use is made of two phase-cycled steady state sequences.

8. The method as claimed in claim 7, wherein measurements are made with the aid of a phase-alternating and a non-phase-alternating sequence.

9. An apparatus including an image computer and a system computer for carrying out a method as claimed in claim 6.

10. The method as claimed in claim 1, wherein use is made of two phase-cycled steady state sequences.

11. The method as claimed in claim 4, wherein measurements are made with the aid of a phase-alternating and a non-phase-alternating sequence.

12. An apparatus including an image computer and a system computer for carrying out a method as claimed in claim 1. measurements are made with the aid of a phase-alternating and a non-phase-alternating sequence.

13. A computer readable medium encoded with a computer program, adapted to, when executed on a computer, cause the computer to carry out the method as claimed in claim 1.

14. An apparatus for improving the image homogeneity of image data from phase-cycled steady state sequences in magnetic resonance tomography, the apparatus comprising:
    means for calculating the sum of squares (SOS) and the maximum intensity projection (MIP), pixel-wise, from the image data of the participating sequences; and
    means for obtaining a result image, optimized with regard to image homogeneity, by pixel-wise combination of the sum-of-squares image and MIP image.

15. The apparatus as claimed in claim 14, wherein the combination takes place in the form of a weighted mean of the sum-of-squares image and MIP image in such a way that the respective SOS value multiplied by a selected factor $p \in [0.1]$ is added, pixel-wise, to the corresponding MIP value multiplied by a factor $q=1-p$.

16. The apparatus as claimed in claim 15, wherein the factor p is selected such that the residual ripple of the result image with reference to variation in amplitude and location is minimized.

* * * * *